(12) United States Patent
Otaguro et al.

(10) Patent No.: US 6,702,099 B2
(45) Date of Patent: Mar. 9, 2004

(54) WORK CONVEYING SYSTEM (75) Inventors: Tetsunori Otaguro, Tokyo (JP); Kazuyuki Matsumura, Tokyo (JP); Takafumi Iseri, Tokyo (JP)

(73) Assignee: Hirata Corporation (JP)

( * ) Notice: Subject to any disclaimer, the term of this patent is extended or adjusted under 35 U.S.C. 154(b) by 0 days.

(21) Appl. No.: 10/225,438

(22) Filed: Aug. 22, 2002

(65) Prior Publication Data

US 2003/0079957 A1 May 1, 2003

(30) Foreign Application Priority Data

Aug. 24, 2001 (JP) ........................................ 2001-253910
Sep. 18, 2001 (JP) ........................................ 2001-283407

(51) Int. Cl.[7] .............................................. B65G 47/34
(52) U.S. Cl. ................................. 198/468.6; 198/346.3
(58) Field of Search .......................... 198/346.1, 346.3, 198/465.1, 465.4, 468.01, 468.2, 468.3, 468.6; 414/744.3, 744.8; 901/6, 7

(56) References Cited

U.S. PATENT DOCUMENTS 5,617,944 A * 4/1997 McTaggart ............... 198/468.6
5,681,138 A * 10/1997 Lust et al. ................ 414/752.1
6,050,389 A * 4/2000 Iida et al. ................. 198/468.6
6,321,138 B1 * 11/2001 Livesay et al. ........... 198/465.1
6,435,336 B1 * 8/2002 Knodler .................... 198/474.1

* cited by examiner

Primary Examiner—James R. Bidwell
(74) Attorney, Agent, or Firm—Lorusso, Loud & Kelly (57) ABSTRACT A work conveying system eliminates gravitational deflection of an extended articulated arm of a vertical mover. The conveying system includes a horizontal mover which carries the vertical mover and a work holder for delivering a workpiece to various apparatuses without dislocation. In conveying a workpiece horizontally, the vertical mover folds compactly to minimize air disturbance. Plural arm elements of the articulated arm overlap and are connected together in an alternate manner at their respective end portions, and the articulated arm is extended and contracted by pivotal movement of the arm elements, driven by a single drive unit. The horizontal mover is movable in an arbitrary horizontal plane within the upper ceiling space within the clean room. Shafts in the articulated arm and a rotary drive unit in the work holder have hollow interiors which are intercommunicated and at a negative pressure.

20 Claims, 10 Drawing Sheets

WORK CONVEYING SYSTEM

BACKGROUND OF THE INVENTION

1. Field of the Invention

The present invention relates to a work conveying system for a clean room and more particularly to a work conveying system which conveys a workpiece to various processing stations in a production line within a clean room for the production of, for example, semiconductor components, liquid crystal display panels, medical supplies, chemicals, and processed foods.

2. Description of the Prior Art

In manufacture of a semiconductor integrated circuit or a liquid crystal display panel, deposition of dust must be avoided. It is desirable that medical supplies, chemicals, and processed foods be produced in a sterile hygienic environment. Therefore, in a wide variety of fields, intra-clean room production lines are utilized.

The present applicant has previously invented a work conveying system (see Japanese Patent Laid Open No. 2000-243808), which system is provided with drive means able to arbitrarily move a work holding means in three dimensions in an upper ceiling space within a clean room. In this work conveying system, a pair of horizontal fixed guide rails are laid in parallel in the ceiling space and one or plural horizontal traveling guide rails are mounted between the paired fixed guide rails for travel along the fixed guide rails. Also, a travel body is mounted for travel along the traveling guide rail(s), and a horizontal moving means is provided by the combination of the fixed guide rails, the traveling guide rail(s) and the travel body. Further, the travel body is provided with a vertical moving means for raising and lowering the work holding means. Thus, three-dimensional movement/conveyance is provided by the combination of the vertical moving means and the horizontal moving means.

Figure 10A:
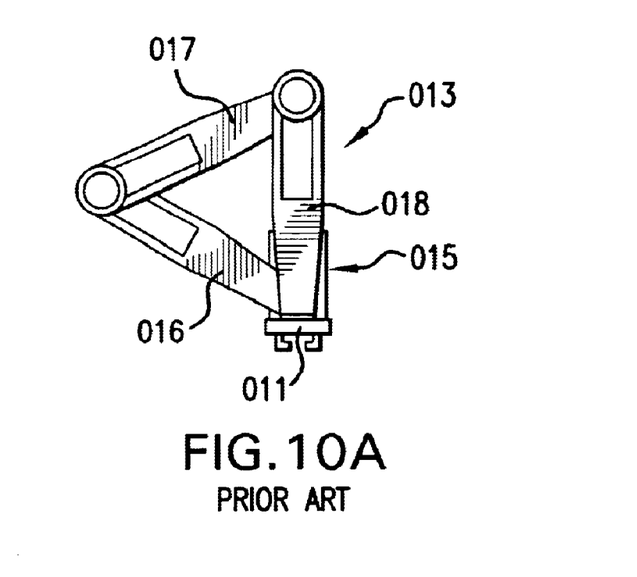
FIG. 10A is a front view of a vertical moving means of a conventional work conveying system, in a raised state.
Figure 10B:
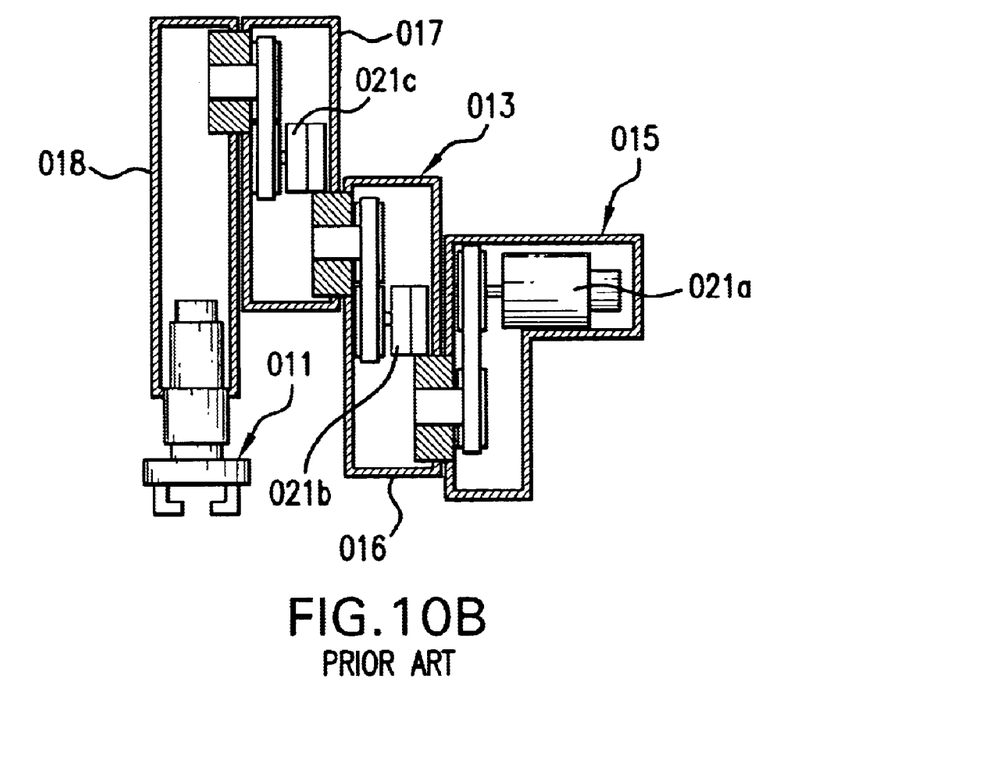
FIG. 10B is a side view in vertical section of the same vertical moving means in a raised state.
Figure 11A:
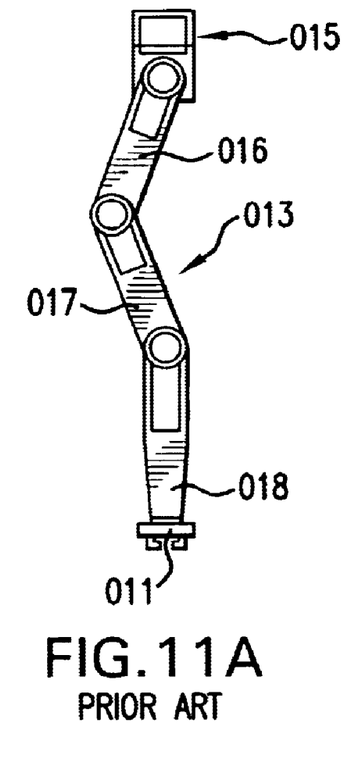
FIG. 11A is a front view of the vertical moving means of the conventional work conveying system shown in FIGS. 10A and 10B, but in a lowered state.
Figure 11B:
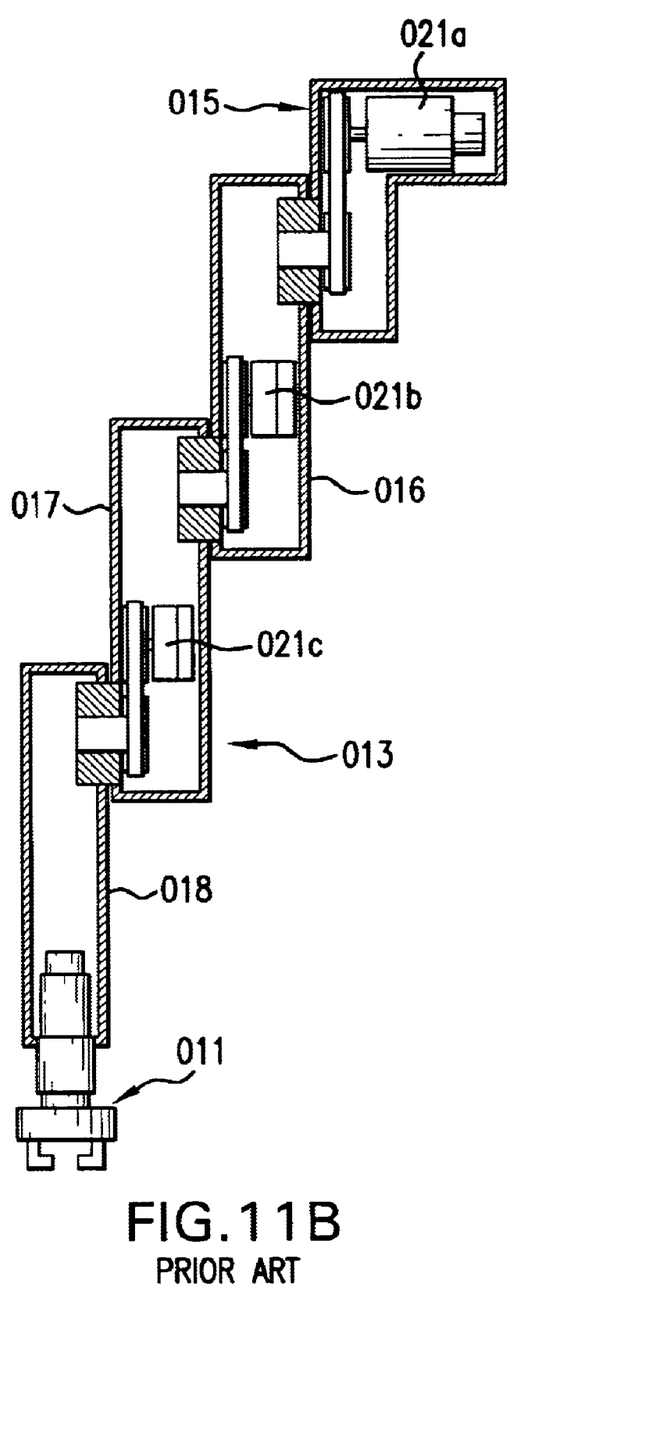
FIG. 11B is a side view in vertical section of the same vertical moving means in a lowered state.

FIGS. 10(A), 10(B), 11(A) and 11(B) show such a vertical moving means 013, in which FIG. 10(A) is a front view showing a raised state of the vertical moving means, FIG. 10(B) is a side view in vertical section, FIG. 11(A) is a front view showing a lowered state thereof, and FIG. 11(B) is a side view in vertical section. As shown in these figures, the vertical moving means 013 is an articulated arm having three arm elements 016–018. With pivotal movements of a first start-end arm element 016, a second arm element 017, and a third (terminal-end) arm element 018, a work holding means 011 fixed to the third (terminal-end) arm element 018 is moved up and down on a vertical line. The work holding means 011 delivers a workpiece (e.g., a hermetically sealed container) to each of various processing apparatuses. As shown in FIGS. 10(B) and 11(B), the articulated arm has the arm elements 016–018 stacked in multiple stages.

The pivotal movements of the arm elements 016–018 are respectively driven by a motor 021a disposed within a body 015, a motor 021b disposed within the first start-end arm element 016, and a motor 021c disposed within the second arm element 017. Though not shown in detail, the interiors of the arm elements 016–018 and the interior of the body 015 are in communication and are under a negative pressure so that dust generated in those interiors is removed in one direction.

With the above-described work conveying system, an area for work conveyance is not required on the floor surface of the clean room and the interior of the clean room can be more effectively utilized. Therefore, for the same equipment, the space required in the clean room can be reduced and it is possible to reduce the equipment cost and operation cost of the clean room. Moreover, the location and orientation of apparatus such as processing chambers installed within the clean room are not restricted and it is possible to select an optimal arrangement. Also in the case of adding a new apparatus such as a processing chamber or in the case of changing the arrangement of items such as processing chambers, it is possible to freely select their arrangement and orientation. Thus, it is also possible to reduce the cost of changing arrangement of or increasing the number of items of apparatus such as processing chambers. Further, it is possible to move the work holding means 011 linearly from one position to another position, whereby the work efficiency in the clean room is improved.

However, in the above-described work conveying system, a torque load based on arm weight is imposed on the mounting portion for mounting to the horizontal moving means and deflection caused by extension of the articulated arm is significant. Further, in the articulated arm of this structure, the pivotal movement of the first start-end arm element 016 relative to the horizontal moving means is performed by operation of a motor 021a provided on the horizontal moving means (travel body 015) side and thus this structure is difficult to seal. In addition, motors 021a–021c are used as dedicated drive sources for pivotal movements of the first to third arm elements 016–018, respectively, and such multiple drive sources are apt to generate dust.

SUMMARY OF THE INVENTION

It is an object of the present invention to solve the above-mentioned problems of the conventional work conveying system and to provide a work conveying system which eliminates gravitational deflection induced upon extension of the articulated arm in the vertical moving means, permits the work holding means to deliver a workpiece to each processing apparatus without dislocation, permits smooth extension and contraction of the articulated arm, permits the vertical moving means to be folded compactly when conveying a workpiece horizontally, thereby minimizing the disturbance of air flow, and which is easily sealed.

It is another object of the present invention to provide a work conveying system which, in the case of workpieces in the form of wafers or reticles, can convey the wafers or reticles each individually and rapidly to a predetermined processing apparatus and can thereby improve the working efficiency.

For solving the foregoing problems, in one aspect of the present invention, there is provided a work conveying system comprising a work holding means for holding a workpiece, a horizontal moving means for moving the work holding means horizontally in an upper ceiling space within a clean room, and a vertical moving means provided in the horizontal moving means and formed as an articulated arm, the articulated arm being adapted to extend and contract, thereby causing the work holding means to move up and down, the workpiece thereby being conveyed to the plural items of apparatus while circulating among the processing stations within the clean room, wherein plural arm elements of the articulated arm are overlapped and connected together at alternating end portions, and the articulated arm is extended and contracted with pivotal movements of the arm elements.

With the above-described first aspect of the invention there is no fear of centroid deviation of the articulated arm and the weight balance of the entire arm is stable, with little gravitational deflection, even upon extension (descent of the vertical moving means). Consequently, it becomes possible for the work holding means to deliver a workpiece to each of various processing apparatuses without dislocation, the extension and contraction of the articulated arm being performed smoothly, and when conveying a work horizontally, the vertical moving means can be folded compactly to minimize the disturbance of air flow. Further, there is no torque based on the weight of the entire arm and the workpiece weight, thus permitting stable conveyance of a workpiece horizontally.

In a second aspect the present invention provides a work conveying system comprising work holding means for holding a workpiece, horizontal moving means for moving the work holding means horizontally and located in an upper ceiling space within a clean room, and an articulated arm, serving as vertical moving means and provided on the horizontal moving means. The articulated arm extends and contracts to thereby cause the work holding means to move up and down, allowing the work to be transferred between the work holding means and each of plural items of processing apparatus, while the workpiece is circulated among the different items of processing apparatus within the clean room. The articulated arm has three or more arm elements, a single drive, and a predetermined pivoting ratio among the arm elements. The articulated arm is extended and contracted linearly by operation of the drive source and consequent pivotal movements of the arm elements, so that by a combined use of a single drive source and three or more arm elements which are interlocked with one another, smooth motion free of impact is ensured.

A third aspect of the present invention provides, in combination with the above-described first aspect, a work conveying system wherein the vertical drive means, constituted by an articulated arm having three or more arm elements, has a single drive source and a predetermined pivoting ratio among the arm elements, and the articulated arm is extended and contracted by operation of the drive source and by consequent pivotal movements of the arm elements. By a combined use of a single drive source and three or more arm elements that are interlocked with one another, there is obtained a smooth impact-free motion.

In a fourth aspect the present invention provides, in combination with the above-described first or second aspect, mounting of the horizontal moving means in the upper ceiling space within the clean room for movement in an arbitrary horizontal plane. The work holding means is also movable in an arbitrary horizontal plane in the upper ceiling space within the clean room, so that the location and orientation of items of processing apparatus, such as processing chambers installed within the clean room, are not restricted and it is possible to select an optimal arrangement. Moreover, also in the case of adding a new item of apparatus, such as a new processing chamber, or in the case of changing the arrangement of the apparatus, it is possible to freely select their arrangement and orientation and hence the cost for changing the arrangement of or adding to the apparatus is reduced. Further, it is possible to move the work holding means linearly from one position to another position and therefore the work processing efficiency within the clean room is improved.

In a fifth aspect the present invention provides, in combination with the above second aspect, pivotal movement of a first start-end arm of the vertical moving means, relative to the horizontal moving means, is driven by a motor disposed on the first arm element. This construction provides for sealing of dust generated from a single drive source (the motor) and the dust generated from the pivoting structure, all on the arm side. Further, by utilizing an empty space, i.e. the internal space within the first arm element, it is possible to accommodate the motor which serves as the sole drive source, thus affording a work conveying system of a compact structure.

In a sixth aspect the present invention provides, in combination with the above first or second aspect, a work conveying system wherein the arm elements of the articulated arm are hollow and the internal spaces within the arm elements are intercommunicated and evacuated to a negative pressure. With this structure discharge of generated dust from the internal space of each of the arm elements is simplified, the amount of dust leaking into the clean room is greatly decreased, and it becomes easy to maintain the clean room at a required degree of cleanliness.

In a seventh aspect the present invention provides, in combination with the above first or second aspect, a work conveying system wherein the work holding means is provided with a work rotation drive unit so that the work can be rotated in a horizontal plane. This work rotation drive unit, in addition to facilitating conveyance of the work in three dimensions, provides a rotational direction/posture control for the work in a horizontal plane and accurate rotational positioning in loading the work, thus fulfilling requirements for high degree of accuracy in a work conveying system.

The present invention may also include a hermetically sealed work container held by the work holding means. Plural wafers or reticles may be accommodated in the hermetically sealed work container and in this state can be conveyed within the clean room, so that it is possible to easily attain the high-degree of cleanliness required for such workpieces.

Alternatively, the work holding means may hold a single workpiece, such as a wafer or a reticle, directly.

Further, the directly held workpiece may bear an identification mark indicating the processing steps to which the workpiece is to be subjected. In this case the apparatus of the present invention further includes a detector for reading the identification mark. In directly holding a single workpiece, the detector on the work holding means reads the identification mark and transmits a signal to a controller in the work conveying system, whereby the work conveying system can convey the workpiece rapidly to each processing apparatus in a predetermined sequence for predetermined working, within the three-dimensional space of a clean room. Consequently, the working efficiency of the work conveying system is improved to a remarkable extent.

Alternatively, the detector for detecting identification marks on workpieces may be disposed at a fixed position within the clean room. The detector reads the identification mark affixed to the workpiece upon arrival of the workpiece at the installed position of the detector and then transmits a signal to a controller in the work conveying system, whereby the work conveying system can convey a single workpiece to each processing apparatus rapidly and in a predetermined sequence for predetermined processings. Consequently, the working efficiency of the work conveying system is greatly improved.

DETAILED DESCRIPTION OF THE PREFERRED EMBODIMENTS

A first embodiment of the present invention will now be described with reference to FIGS. 1 to 6.

Figure 1:
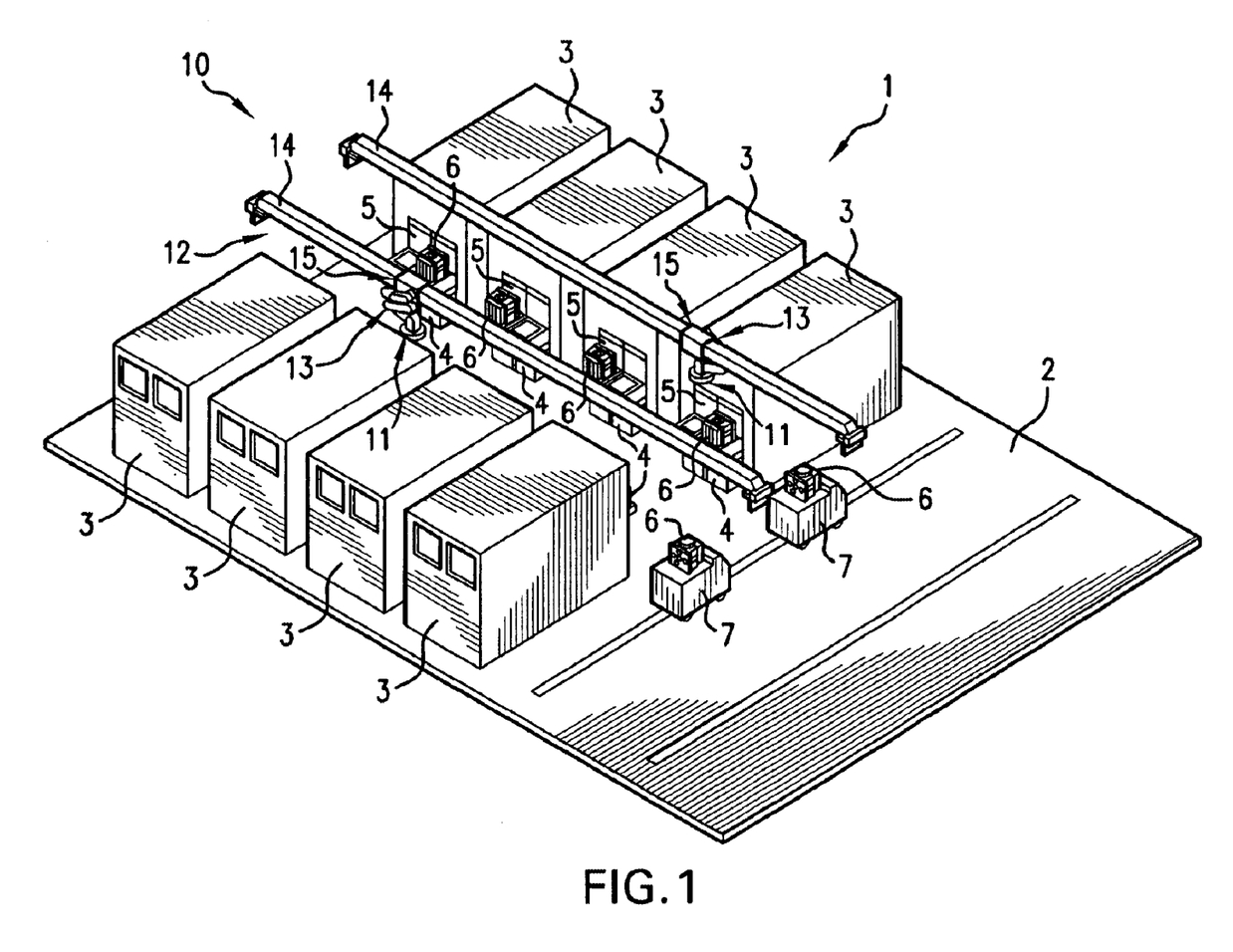
FIG. 1 is a perspective view of a production line in a clean room having a work conveying system according to a first embodiment of the present invention.

In a production line 1 within a clean room to which the work conveying system of this first embodiment is applied, as shown in FIG. 1, plural processing chambers (processing apparatuses) 3 are arranged side by side in two rows, on a floor surface 2 in the clean room, with an interface device 4 attached to each processing chamber 3.

The processing chambers 3 perform different process steps on workpieces in sequence. However, taking tact time in work processing into account, a plurality of identical processing chambers may be included in the production line. For example, the processing chambers 3 are semiconductor wafer processing units for conducting processes such as application of resist, exposure, development, ion implantation, annealing, and sputtering. Although the following description is provided with such processings of a semiconductor wafer in mind, the work conveying system in question is also applicable to reticle processing apparatus.

The interface devices 4 constitute buffer spaces for isolating the processing chambers 3 from the clean room. The delivery of workpieces to each processing chamber 3 is executed through the associated interface device 4. A work inlet/outlet 5 in each interface device 4 is hermetically sealed except when loading or unloading a workpiece.

Adjacent processing chambers 3 and interface devices 4 are arranged to leave only a minimum maintenance area required for work by maintenance personnel or operating personnel. Thus, the floor area of the clean room which is occupied by such apparatus is minimized to make the most use of the clean room and to attain an efficient conveyance of workpieces by the work conveying system 10, which will be described later. But it is not always necessary that the processing chambers 3 be arranged in plural rows, or with a front side (the side where each interface device 4 is provided) facing a particular direction. A certain degree of randomness of arrangement is allowed.

Mounted within the upper space of the clean room, the work conveying system 10 conveys a hermetically sealed container (work container) 6 to the processing chambers 3 in a predetermined sequence, the container 6 containing plural sheet-like workpieces, e.g. wafers or reticles. In order to maintain the required high-degree of cleanliness, the workpieces are conveyed in a hermetically sealed state within the container 6. The floor surface 2 provides a space for the travel of work carriers 7. When a work carrier 7 receives the hermetically sealed container 6 which has been conveyed from outside the clean room, the work carrier 7 travels to a predetermined position along a rail, and delivers the container 6 to the work conveying system 10.

The work conveying system 10 is provided with work holding means 11 for holding the hermetically sealed container 6, horizontal moving means 12 for moving the work holding means 11 horizontally within the upper ceiling space of the clean room, and vertical moving means 13 in the form of an articulated arm and provided in conjunction with the horizontal moving means 12. In the vertical moving means 13, the articulated arm is extended and contracted to raise and lower the work holding means 11, thereby transferring workpieces between the work holding means 11 and each of the processing chambers 3. A three-dimensional moving mechanism is provided by the combination of the horizontal moving means 12 and the vertical moving means 13.

Horizontal Moving Means 12

As shown in FIG. 1, the horizontal moving means 12 comprises a pair of horizontal fixed guide rails 14 which are laid in parallel in the upper ceiling space within the clean room and traveling bodies 15 respectively installed on the fixed guide rails 14 and adapted to travel along the guide rails 14. Though not shown in detail, a drive mechanism for each traveling body 15 has a motor integral with the traveling body 15 and received within the associated fixed guide rail 14. A roller fixed onto a rotary shaft of the motor is adapted to roll along an inner wall surface of the fixed guide rail 14, whereby the traveling body 15 is guided along the fixed guide rail. A base end portion of the vertical moving means 13 (a base end portion of the first start-end arm element 16, which is described later) is pivotally connected to the traveling body 15 and is adapted to travel together with the traveling body 15.

Figure 2:
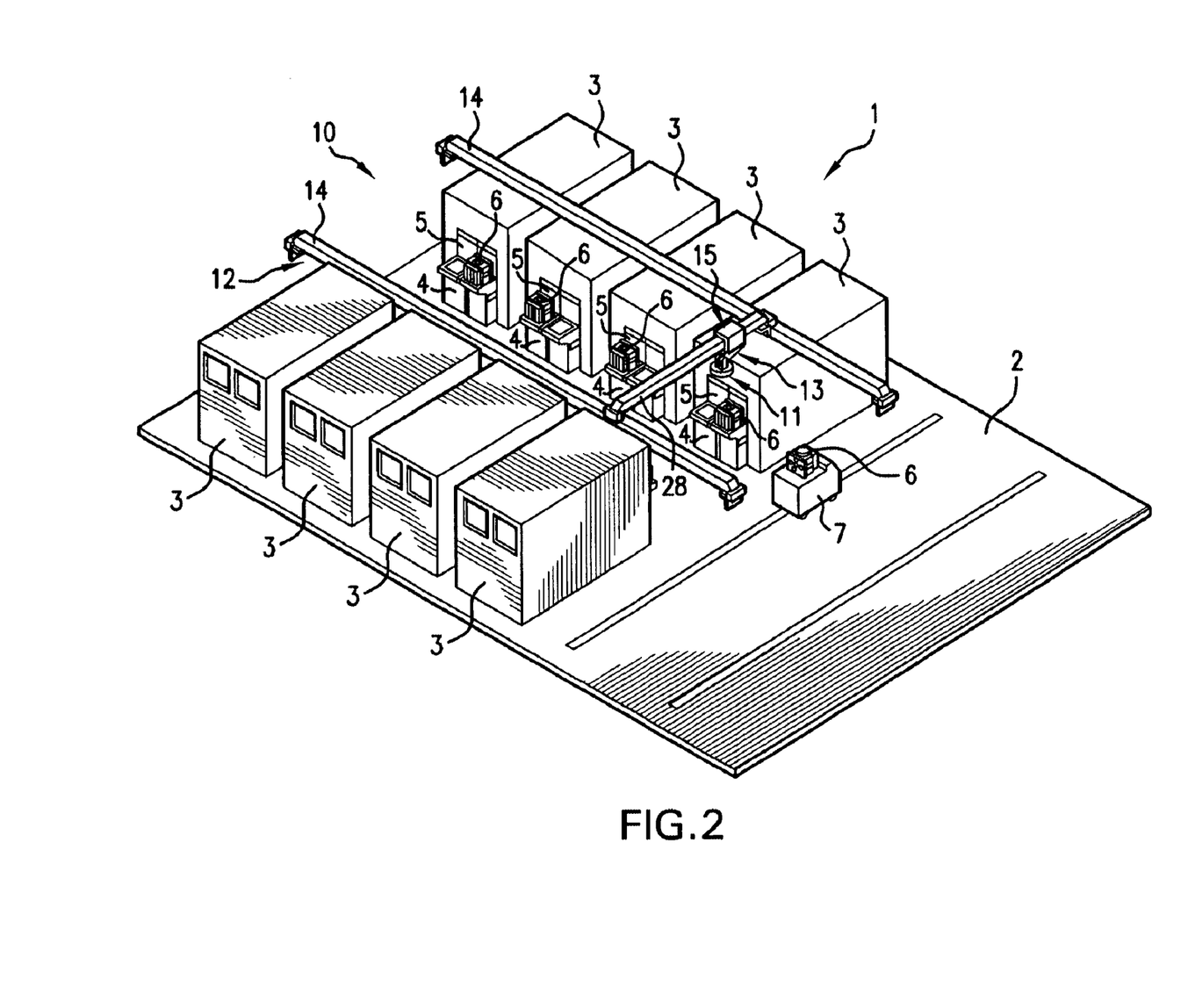
FIG. 2 is a perspective view of a production line in a clean room according to a modification of the first embodiment of FIG. 1.
Figure 3:
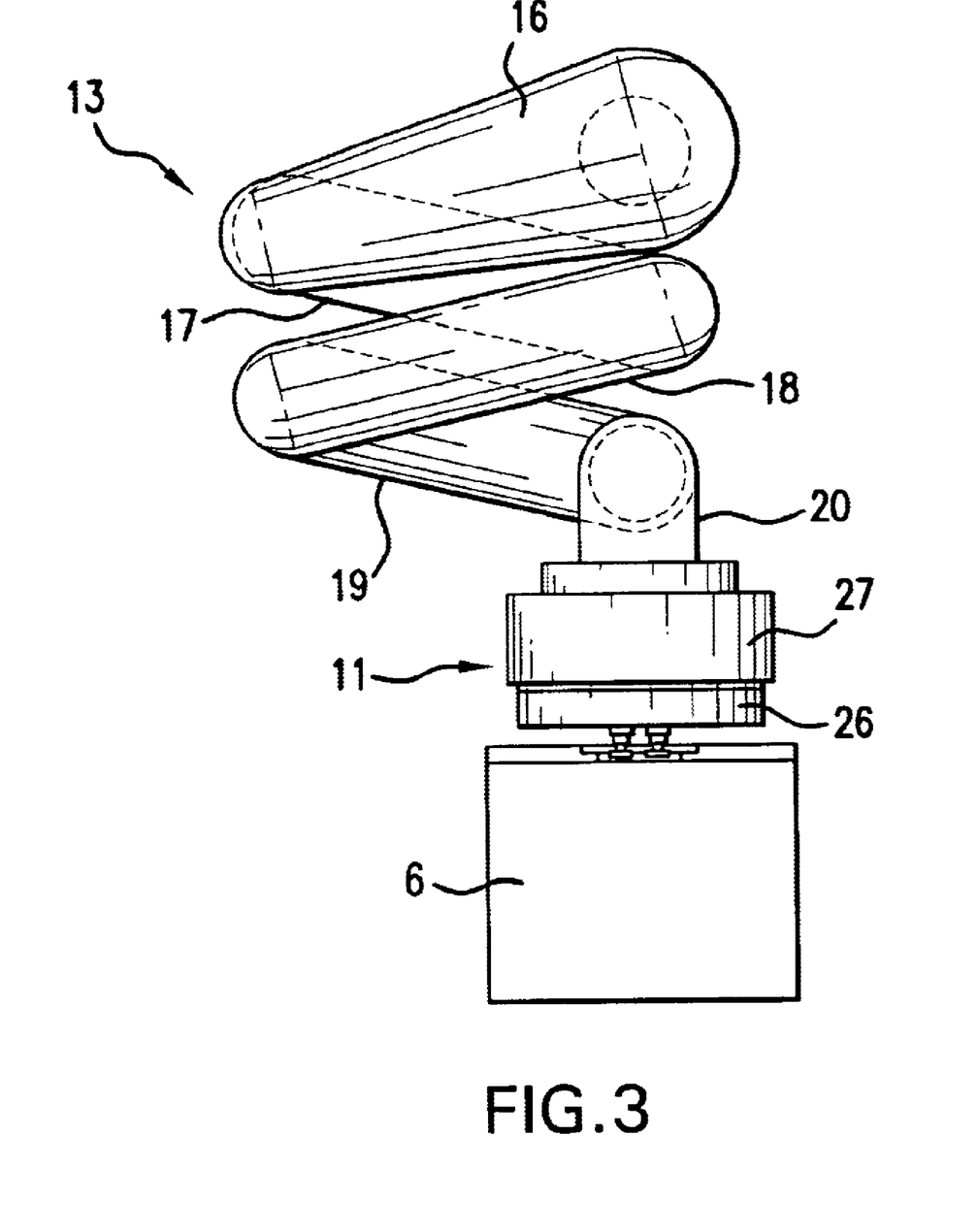
FIG. 3 is a front view of a vertical moving means of the work conveying system, in a raised state.

The horizontal moving means 12 may be modified as shown in FIG. 2. In the horizontal moving means 12 in FIG. 2, a pair of horizontal fixed guide rails 14 are disposed in parallel in the upper ceiling space of the clean room and one or plural traveling guide rails 28 are mounted between the fixed guide rails 14, and a traveling body 15, adapted to travel along a traveling guide rail 28, is carried on the same guide rail 28. Thus, in this modification, the horizontal moving means 12 can arbitrarily move within the upper ceiling space of the clean room and in a horizontal plane sandwiched between the pair of fixed guide rails 14. By moving the vertical moving means 13 and the work holding means 11 linearly from one position to another position on the opposite side with respect to the central passage, workpieces can be transferred between the work holding means 11 and each processing chamber 3. The spacing between the pair of horizontal fixed guide rails 14 is set appropriately in accordance with the arrangement (installation position and orientation) of the processing chambers 3, which spacing may be over the full width of the clean room.

Vertical Moving Means 13

As shown in FIGS. 3 to 6, the vertical moving means 13 is an articulated arm having five arm elements 16–20. As noted above, the base end portion of the first start-end arm element 16 is pivotally connected to the traveling body 15 so that the vertical moving means 13 can travel in a horizontal plane together with the traveling body 15.

Figure 4:
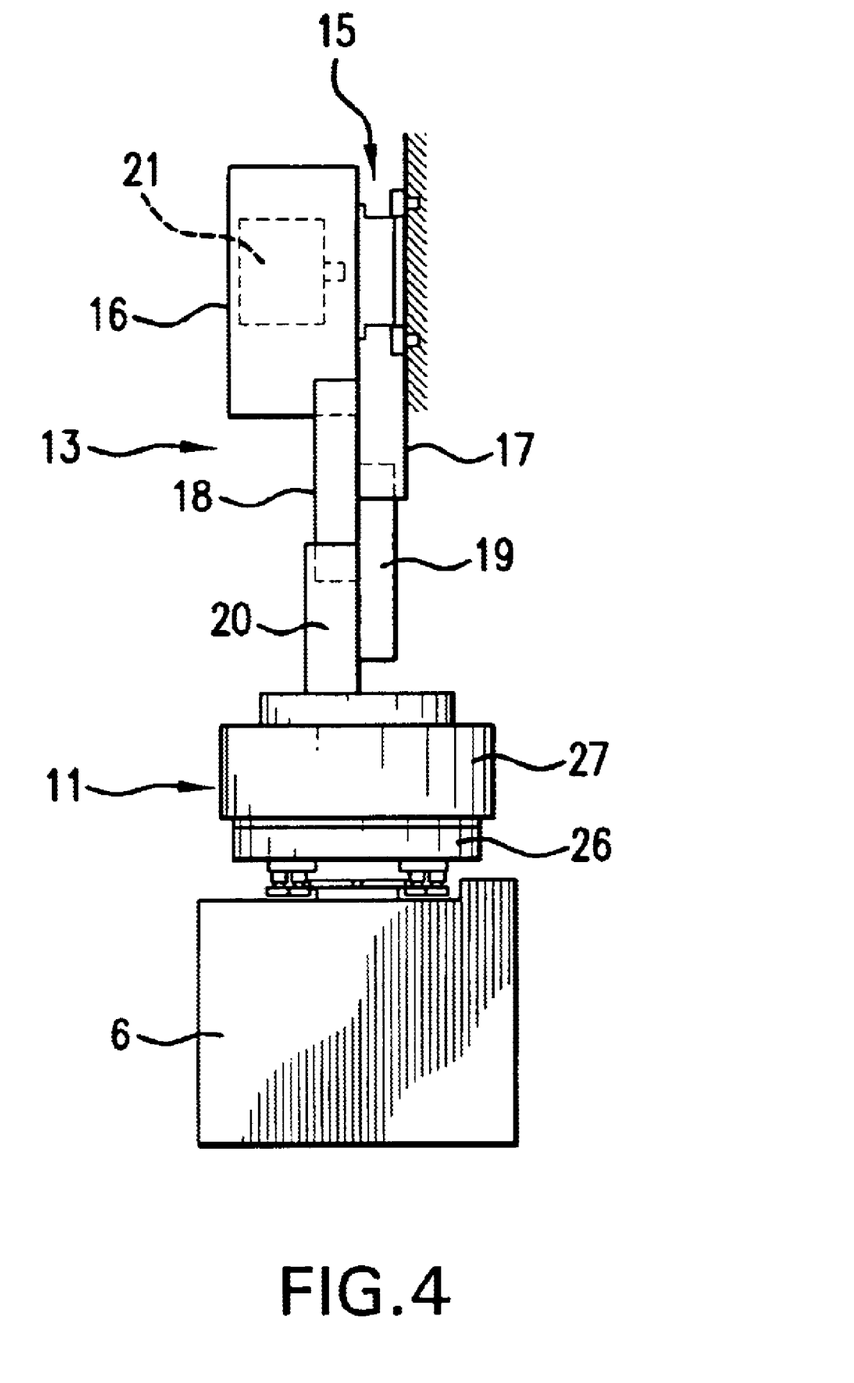
FIG. 4 is a side view of the vertical moving means of FIG. 3.
Figure 5:
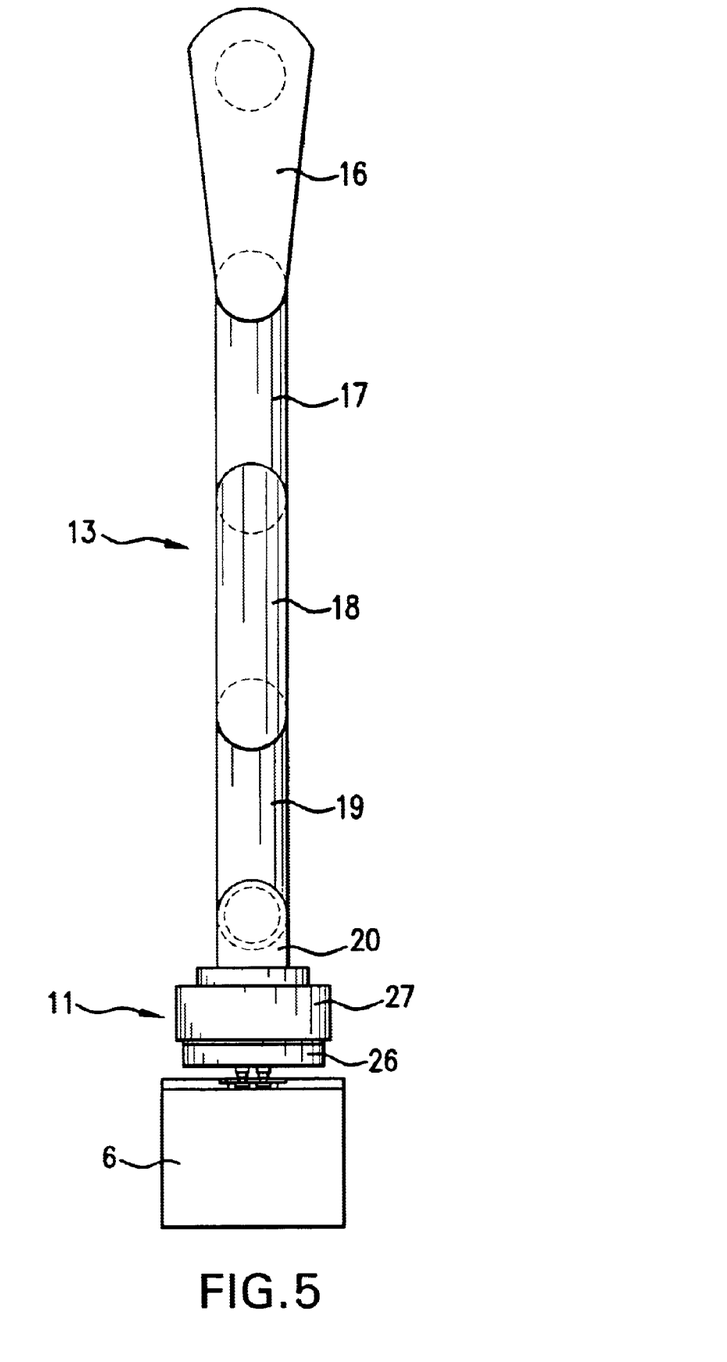
FIG. 5 is a front view showing the vertical moving means of FIG. 3 in a lowered state.
Figure 6:
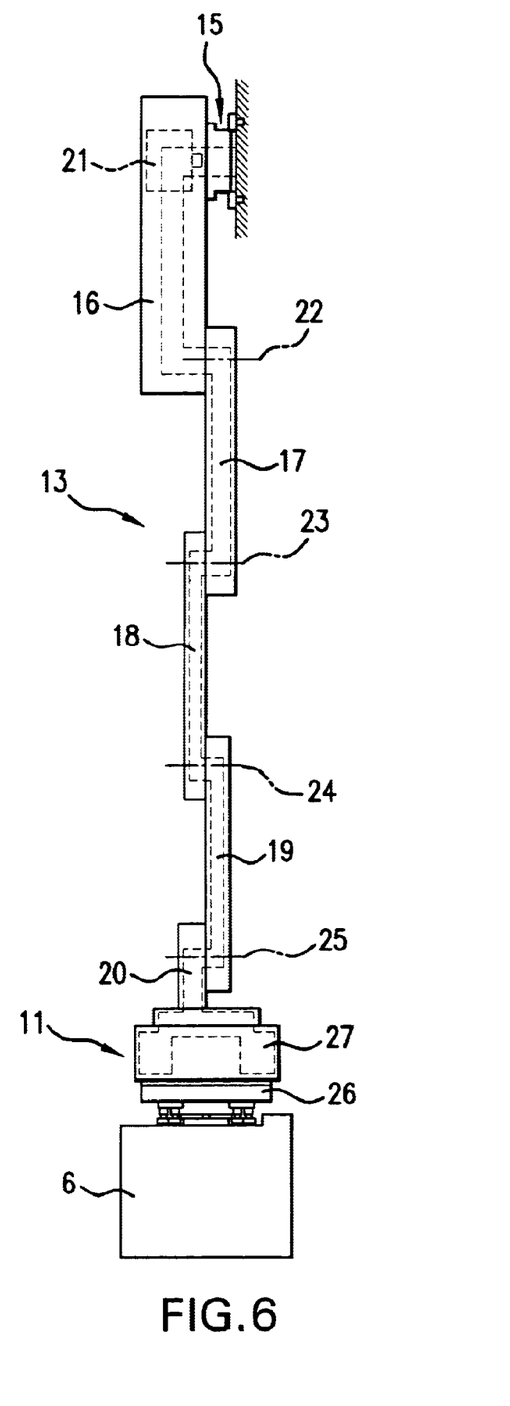
FIG. 6 is a side view of the vertical moving means in a lowered position.

As best shown in FIGS. 4 and 6, the five arm elements 16–20 are successively arranged in an alternating manner such that, with respect to one virtual vertical plane A (see FIG. 4), the first start-end arm element 16 is located on the left-hand side, the second arm element 17 on the right-hand side, and the third arm element 18 on the left-hand side, the arm elements being overlapped and connected at their respective end portions. By so doing, the center of gravity of the articulated arm is not dislocated and the weight balance of the entire arm is stable, so that gravitational deflection is diminished upon extension of the articulated arm (upon lowering of the vertical moving means 13). Further, as is apparent from a comparison between FIG. 7 (conventional) and FIG. 4, the folded state of the vertical moving means 13 is compact, whereby disturbance of air with travel of the vertical moving means 13 is kept to a minimum.

The vertical moving means 13 has a motor 21 as the sole drive means and has a structure with a certain pivoting ratio (1:2:1:2:1) among the arm elements. The whole of the articulated arm (vertical moving means 13) extends and contracts with operation of the motor 21 and consequent pivotal movements of the arm elements 16–20. As a result, the work holding means 11 fixed to the fifth terminal-end arm element 20 rises and falls on a straight line. These rising and falling motions are performed automatically under control of the motor 21. With a pivoting ratio among the arm elements, which is based on 1:2:1, the number of arm elements which constitute the articulated arm is not limited to five, but may be three or seven.

As shown in FIGS. 4 and 6, the motor 21 is installed on the first arm element 16 side unlike the prior art wherein it is installed on the traveling body 15 side. An upper empty space in the interior of the first arm element 16 is utilized to receive the motor 21. According to this construction, the sealing of dust generated by the motor 21 as the sole drive means and the sealing of dust generated from the pivoting among the arm elements may both be on the arm side, thus affording a structure easy to seal. The pivoting of the first start-end arm 16 for the horizontal moving means 12, as well as the pivoting of the second to fifth arm elements 17–20, are by operation of the motor 21. The structure having a certain pivoting ratio of arm elements may be a known transmission mechanism such as one using plural pulleys having diameters of a predetermined ratio and plural belts gearing in the form of a linkage of only plural gears, or a linkage of only plural wires.

Joint shafts 22–25 (see FIG. 6) which pivotally connect adjacent arm elements of the five constituent arm elements 16–20 of the articulated arm, have a hollow structure, and the internal spaces of the arm elements 16–20 are in mutual communication and maintained at a negative pressure. A work rotation drive unit 27 provided in the work holding means 11 also has a hollow structure which is in communication with the internal spaces of the arm elements 16–20 (see the communication path indicated by chain lines in FIG. 6). Dust generated from the drive unit is evacuated by the negative pressure to the arm side.

The dust generated in the internal spaces of the arm elements 16–20 and the work rotation drive unit 27 is evacuated into the hollow interior of the associated fixed guide rail 14 through the internal space of the traveling body 15 and is discharged to the exterior of the clean room from a discharge port formed on one end side of the guide rail. Alternatively, the air is discharged into the clean room through one or plural filters installed midway of the fixed guide rail 14. Accordingly, this structure simplifies the discharge of dust generated in the internal spaces of the arm elements 16–20 and in the work rotation drive unit 27.

As noted earlier, the work holding means 11 is fixed to the fifth terminal-end arm element 20, and with work holder 26 holding the top of the hermetically sealed container 6, the work holding means 11 is raised by the vertical moving means 13 and is conveyed to a predetermined processing chamber 3 by the horizontal moving means 12. Then, when the work holding means 11 arrives at the predetermined processing chamber 3, it is lowered by the vertical moving means 13 and the work holder 26 releases the container 6, which in turn is placed on a table of the associated interface device 4. At this time, if there is a necessity for correcting the orientation in which the container 6 is placed, the work rotation drive unit 27 in the work holding means 11 is operated to cause the container 6 to rotate a required degree in a horizontal plane, whereby the orientation in which the container 6 is placed can be corrected.

In operation of the first embodiment the center of gravity of the articulated arm is not dislocated, the weight balance of the entire arm is stable, and there occurs little gravitational deflection even upon extension of the articulated arm (upon lowering of the vertical moving means 13). Consequently, it becomes possible for the work holding means 11 to deliver the workpieces to each processing apparatus in succession without any positional deviation, and the extension and contraction of the articulated arm is smooth. Thus, when conveying the works horizontally, the disturbance of the air can be kept to a minimum by folding the vertical moving means 13 compactly. Since no torque is created by the weight of the entire arm and the weight of the workpieces, it is possible to effect a stable horizontal conveyance of the workpieces.

Further, since the work rotary drive unit 27 has a hollow structure in communication with the hollow interiors of the arm elements 16–20 and the dust generated from the drive unit is evacuated due to a negative pressure, the structure for discharging the dust generated in the rotary drive unit 27 is simplified, the discharge of the dust becomes easier, the amount of dust leaking into the clean room is greatly decreased, and it becomes still easier to maintain the cleanliness of the clean room.

Further, since plural workpieces in the form of wafers or reticles are received within the hermetically sealed container 6 and are held by the work holding means 11, the workpieces are conveyed in a hermetically sealed state within the clean room and therefore it is also possible to easily attain the high-degree of cleanliness required for the workpieces.

Second Embodiment

A second embodiment of the invention will now be described with reference to FIGS. 7 and 8. Features also present in the first embodiment are identified by the same reference numerals.

Figure 7:
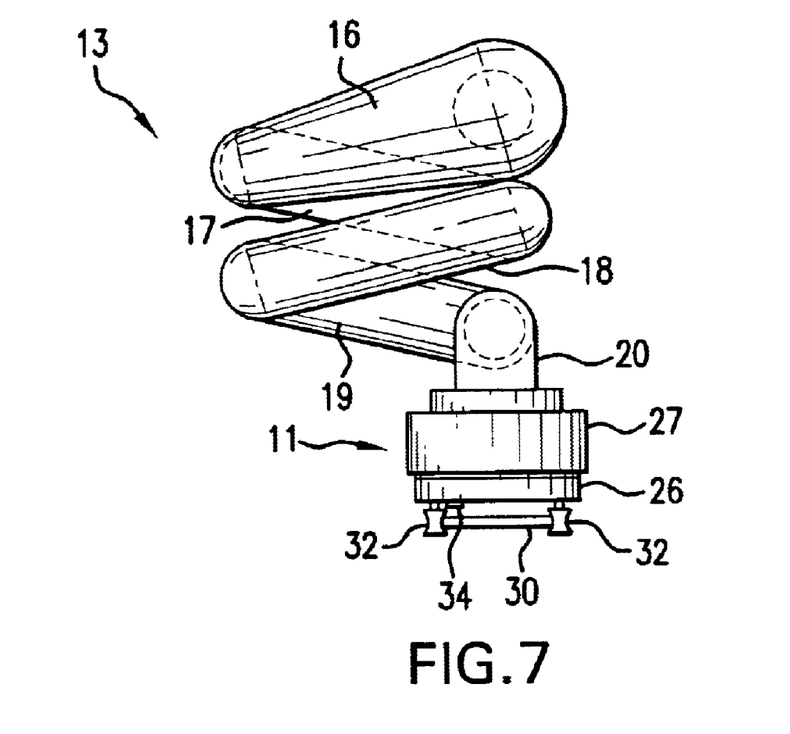
FIG. 7 is a front view showing a raised state of a vertical moving means provided in a work conveying system according to a second embodiment, and corresponds to FIG. 3.

In the work conveying system 10 of this second embodiment, a work holder 26 of a work holding means 11 directly holds a single workpiece 30 such as wafer or reticle, as shown in FIG. 7. More specifically, plural hands 32 suspended from a lower surface of the work holder 26 hold the workpiece 30 at plural peripheral edge positions.

Figure 8:
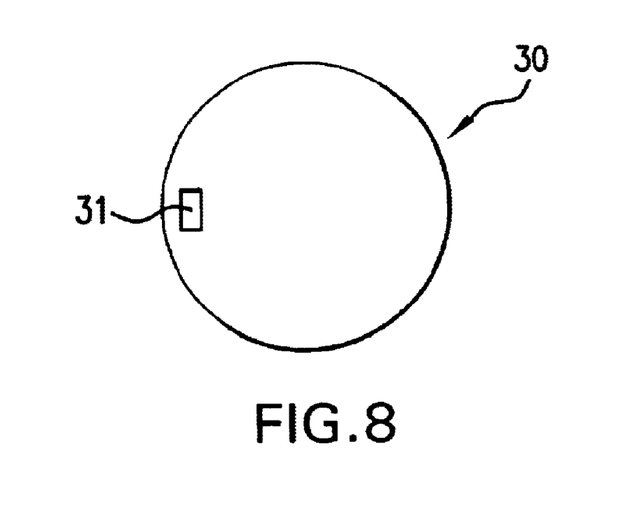
FIG. 8 is a plan view of a workpiece held by a work holding means in the work conveying system of the present invention.

As shown in FIG. 8, an identification mark 31 indicating the process steps to which the workpiece 30 is to be subjected is affixed to each workpiece 30, and a detector 34 for reading the identification mark 31 is provided on a lower surface of the work holder 26 of the work holding means 11.

This second embodiment is different from the first embodiment with regard to the above-described features, but is not different with regard to other features of the first embodiment, so a detailed description thereof will be omitted.

In this second embodiment as described above, when the work holder 26 of the work holding means 11 holds a single workpiece 30, the identification mark detecting means 34 detects the identification mark 31 affixed to the workpiece 30 and transmits a detection signal to the controller of the work conveying system 10, which in turn conveys the workpiece 30 rapidly to each processing chamber (processing apparatus) 3 in a predetermined sequence, making it possible to process the workpiece 30 singly within the three-dimensional space of the clean room. Consequently, the working efficiency of the work conveying system 10 can be improved to a remarkable extent.

Third Embodiment

Figure 9:
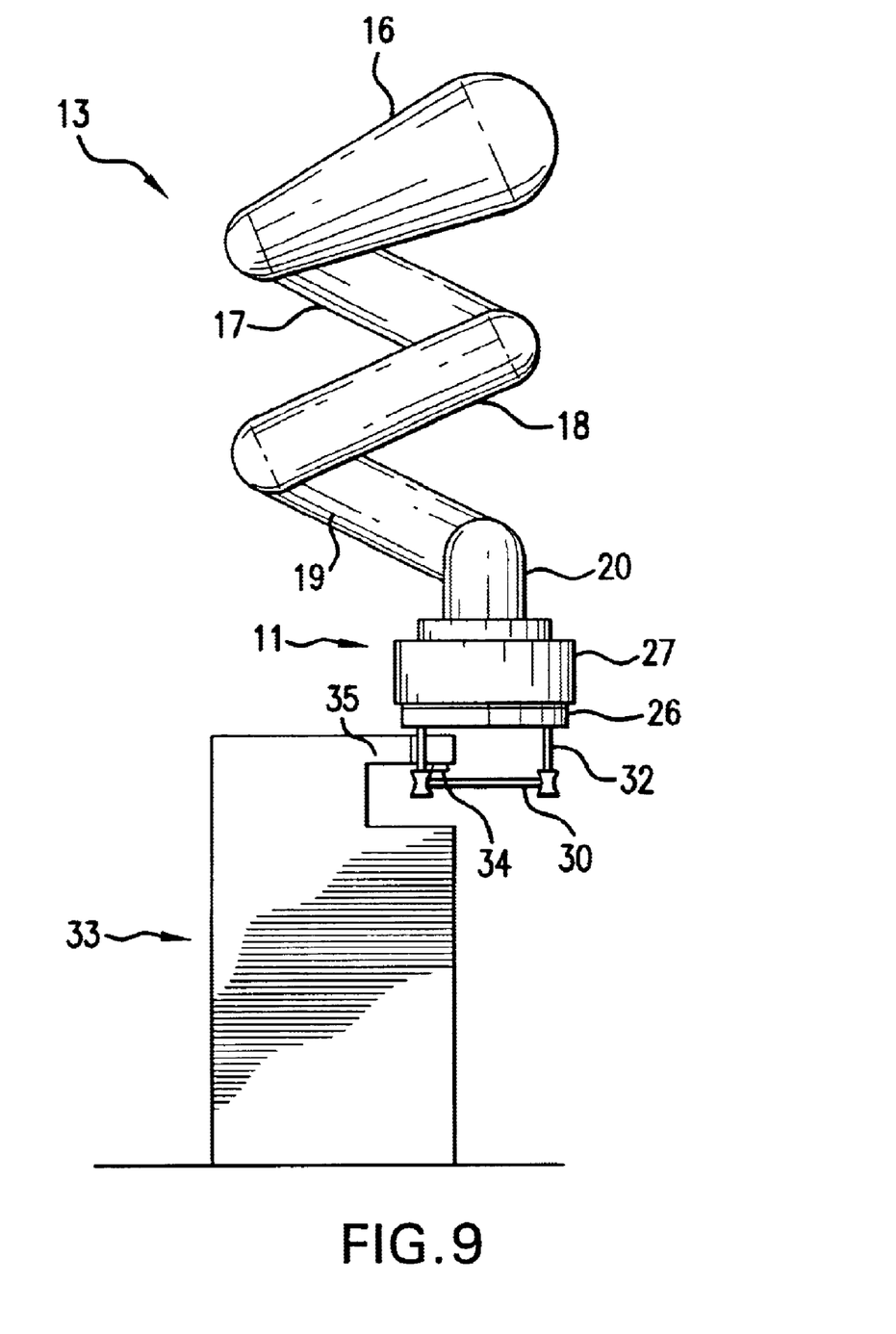
FIG. 9 is a front view of an identification mark detecting device for detecting an identification mark affixed to a workpiece, the identification mark detecting device being installed within a clean room having a work conveying system according to a third embodiment of the present invention.

A third embodiment of the invention will now be described with reference to FIG. 9. Features corresponding to those found in the second embodiment are identified by the same reference numerals.

In the work conveying system 10 of this third embodiment, an identification mark detecting device with detector 34 for detecting the identification mark 31 affixed to a single workpiece 30 is installed within the clean room. As shown in FIG. 9, the identification mark detecting device 33 is provided at an upper corner thereof with a projection 35 capable of entering between the lower surface of the work holder 26 in the work holding means 11 and the workpiece 30. The detector 34 is provided on the lower surface of the projection 35. Alternatively, the detector 34 may be incorporated in the tip of the projection 35.

This third embodiment is different from the second embodiment with regard to the above-described features, but is not different from other features of the second embodiment, a detailed description of which will be omitted.

In this third embodiment as described above, the identification mark detecting device 33 detects the identification mark 31 affixed to the individual workpiece 30 which has been conveyed to the position where the detecting device is installed and transmits the detection signal to the controller of the work conveying system 10, which in turn conveys the individual workpiece 30 rapidly to each processing chamber (processing apparatus) 3 in a predetermined sequence, thus permitting the workpiece to be subjected to various operations. In this way it is possible to greatly improve the working efficiency of the work conveying system 10.

The present invention is not limited to the above embodiments, but various modifications may be made without departing from the gist of the invention.

The entirety of the teachings of Japanese patent applications Nos. 2001-253910 and 2001-283407, inclusive of their specifications, claims and drawings, are incorporated herein by reference.

What is claimed is:

1. A work conveying system comprising:

work holding means for holding a workpiece;

horizontal moving means for moving said work holding means horizontally in an upper ceiling space within a clean room; and vertical moving means provided in said horizontal moving means and including an articulated arm, said articulated arm including plural arm elements with respective ends which overlap and are connected in succession in an alternating manner, said articulated arm being extended and retracted with pivotal movement of said arm elements, thereby causing said work holding means to move up and down, allowing the workpiece to be transferred between the work holding means and each of plural processing apparatuses, the workpiece being conveyed among the plural processing apparatuses by said horizontal moving means.

2. A work conveying system comprising:

work holding means for holding a workpiece;

horizontal moving means for moving said work holding means horizontally in an upper ceiling space within a clean room; and vertical moving means provided in said horizontal moving means and including an articulated arm, said articulated arm including plural arm elements with respective ends which overlap and are connected in succession in an alternating manner, said articulated arm being extended and retracted with pivotal movement of said arm elements, thereby causing said work holding means to move up and down, allowing the workpiece to be transferred between the work holding means and each of plural processing apparatuses, the workpiece being conveyed among the plural processing apparatuses by said horizontal moving means, said vertical moving means having a single drive unit and a predetermined pivoting ratio among said arm elements, said articulated arm being extended and contracted by operation of said drive unit and by consequent pivotal movements of said arm elements.

3. A work conveying system according to claim 1, wherein said vertical moving means has at least three arm elements, a single drive unit, and a predetermined pivoting ratio among said arm elements.

4. A work conveying system according to claim 1, wherein in the upper ceiling space within said clean room said horizontal moving means is movable arbitrarily in a horizontal plane.

5. A work conveying system according to claim 2, wherein in said vertical moving means, the pivotal movement of a first terminal arm element relative to said horizontal moving means is performed by operation of said drive unit disposed in said first terminal arm element.

6. A work conveying system according to claim 1, wherein arm elements have hollow interiors are in communication and under negative pressure.

7. A work conveying system according to claim 1, wherein said work holding means is provided with a rotary drive unit so that the workpiece can be rotated in a horizontal plane.

8. A work conveying system according to claim 6, wherein said work holding means is provided with a rotary drive unit for rotating a work holding unit so that the workpiece can be rotated in a horizontal plane, said rotary drive unit having a hollow interior in communication with the hollow interiors of said arm elements so that dust generated from said drive unit enters into the hollow interiors of the arm elements due to the negative pressure.

9. A work conveying system according to claim 1, wherein the workpiece is a wafer or a reticle, and further comprising a work container held by said work holding means, said work container accommodating plural workpieces.

10. A work conveying system comprising:

work holding means for directly holding a single workpiece;

horizontal moving means for moving said work holding means horizontally in an upper ceiling space within a clean room;

vertical moving means, provided in said horizontal moving means, for moving said work holding means up and down so that the single workpiece is transferred between said work holding means and each of plural processing apparatuses, the single workpiece being conveyed among the plural processing apparatuses by said horizontal means for different processing steps within said clean room; and detecting means for recognizing the processing steps to which the single workpiece is to be subjected by reading an identification mark affixed to the single workpiece.

11. A work conveying system comprising:

a work holding means for holding a work alone such as a wafer or a reticle directly;

a horizontal moving means for moving:;said work holding means horizontally in an upper ceiling space within a clean room; and a vertical moving means provided in said horizontal moving means, said vertical moving means causing said work holding means to move up and down, allowing the work alone to be delivered between said work holding means and each of plural processing apparatuses, the work alone being conveyed to the plural processing apparatuses while circulating among the processing apparatuses within said clean room, wherein an identification mark for recognizing processing steps which the work alone is to follow is affixed to the work, and an identification mark detecting device provided with a detector for detecting said identification mark is disposed within said clean room.

12. A work conveying system according to claim 2, wherein in the upper ceiling space within said clean room said horizontal moving means is movable in an arbitrary horizontal plane.

13. A work conveying system according to claim 2, wherein joint shafts in said articulated arm are of a hollow structure and internal spaces of the arms are intercommunicated and supplied with a negative pressure.

14. A work conveying system according to claim 2, wherein said work holding means is provided with a work rotation drive unit so that the work can be rotated in a horizontal plane.

15. A work conveying system according to claim 13, wherein said work holding means is provided with a work rotation drive unit for rotating a work holding unit in the work holding means so that the work can be rotated in a horizontal plane, said work rotation drive unit having a hollow structure and being in communication with internal spaces of the arms so that dust generated from said drive unit is sucked into the internal spaces of the arms by virtue of the negative pressure.

16. A work conveying system according to claim 12, wherein the work is a wafer or a reticle, and plural said wafers or reticles are received within a work container and are held in this state by said work holding means.

17. A work conveying system according to claim 3, wherein the work is a wafer or a reticle, and plural said wafers or reticles are received within a work container and are held in this state by said work holding means.

18. A work conveying system according to claim 4, wherein the work is a wafer or a reticle, and plural said wafers or reticles are received within a work container and are held in this state by said work holding means.

19. A work conveying system according to claim 5, wherein the work is a wafer or a reticle, and plural said wafers or reticles are received within a work container and are held in this state by said work holding means.

20. A work conveying system according to claim 6, wherein the work is a wafer or a reticle, and plural said wafers or reticles are received within a work container and are held in this state by said work holding means.

* * * * *

UNITED STATES PATENT AND TRADEMARK OFFICE
CERTIFICATE OF CORRECTION

PATENT NO.       : 6,702,099 B2  
APPLICATION NO.  : 10/225438  
DATED            : March 9, 2004  
INVENTOR(S)      : Otaguro et al.

Page 1 of 1

It is certified that error appears in the above-identified patent and that said Letters Patent is hereby corrected as shown below:

Please cancel claim 11 and please add claims 21 and 22.

Col. 12 Line 46-49
--21. A work conveying system according to claim 10 wherein said detection means includes a detector mounted on said work holding means.

22. A work conveying system according to claim 10 wherein said detection means includes at least one detector mounted fixed at a processing apparatus.--

Signed and Sealed this

Eighteenth Day of July, 2006

JON W. DUDAS  
*Director of the United States Patent and Trademark Office*